(12) United States Patent
Yati et al.

(10) Patent No.: US 10,957,608 B2
(45) Date of Patent: Mar. 23, 2021

(54) GUIDED SCANNING ELECTRON MICROSCOPY METROLOGY BASED ON WAFER TOPOGRAPHY

(71) Applicant: KLA-Tencor Corporation, Milpitas, CA (US)

(72) Inventors: Arpit Yati, Lucknow (IN); Shivam Agarwal, Ghaziabad (IN); Jagdish Saraswatula, Chennai (IN); Andrew Cross, Cheshire (GB)

(73) Assignee: KLA-Tencor Corporation, Milpitas, CA (US)

( * ) Notice: Subject to any disclaimer, the term of this patent is extended or adjusted under 35 U.S.C. 154(b) by 107 days.

(21) Appl. No.: 15/814,884

(22) Filed: Nov. 16, 2017

(65) Prior Publication Data

US 2018/0315670 A1 Nov. 1, 2018

Related U.S. Application Data

(60) Provisional application No. 62/516,555, filed on Jun. 7, 2017.

(30) Foreign Application Priority Data

Apr. 28, 2017 (IN) .............................. 201741015075

(51) Int. Cl.
| | |
|---|---|
| H01L 21/66 | (2006.01) |
| H01J 37/28 | (2006.01) |
| H01L 21/67 | (2006.01) |

(52) U.S. Cl.
CPC .............. *H01L 22/12* (2013.01); *H01J 37/28* (2013.01); *H01L 21/67288* (2013.01); *H01L 22/20* (2013.01); *H01J 2237/22* (2013.01); *H01J 2237/24592* (2013.01); *H01J 2237/2809* (2013.01); *H01J 2237/2817* (2013.01); *H01J 2237/31798* (2013.01)

(58) Field of Classification Search
None
See application file for complete search history.

(56) References Cited

U.S. PATENT DOCUMENTS

| | | | | |
|---|---|---|---|---|
| 6,353,222 | B1 * | 3/2002 | Dotan ...................... | H01J 37/28 250/307 |
| 2004/0158409 | A1 * | 8/2004 | Teshima ................ | H01J 37/302 702/22 |
| 2005/0221229 | A1 * | 10/2005 | Nasser-Ghodsi ........ | G01N 1/32 430/296 |
| 2010/0303334 | A1 * | 12/2010 | Kitamura ................. | G06K 9/00 382/141 |
| 2013/0082174 | A1 * | 4/2013 | Chen ...................... | G06T 7/0006 250/307 |
| 2017/0018069 | A1 * | 1/2017 | Vaid ....................... | G06T 7/0004 |

* cited by examiner

*Primary Examiner* — James Choi
(74) *Attorney, Agent, or Firm* — Hodgson Russ LLP

(57) ABSTRACT

A wafer topography measurement system can be paired with a scanning electron microscope. A topography threshold can be applied to wafer topography data about the wafer, which was obtained with the wafer topography measurement system. A metrology sampling plan can be generated for the wafer. This metrology sampling plan can include locations in the wafer topography data above the topography threshold. The scanning electron microscope can scan the wafer using the metrology sampling plan and identify defects.

20 Claims, 3 Drawing Sheets

(A)  (B)  (C)

(D)

GUIDED SCANNING ELECTRON MICROSCOPY METROLOGY BASED ON WAFER TOPOGRAPHY

CROSS-REFERENCE TO RELATED APPLICATIONS

This application claims priority to Indian App. No. 201741015075, filed Apr. 28, 2017, and U.S. App. No. 62/516,555, filed Jun. 7, 2017, the disclosures of which are hereby incorporated by reference.

FIELD OF THE DISCLOSURE

This disclosure relates to defect identification based on wafer topography.

BACKGROUND OF THE DISCLOSURE

Evolution of the semiconductor manufacturing industry is placing ever greater demands on yield management and, in particular, on metrology and inspection systems. Critical dimensions are shrinking while wafer size is increasing. Economics is driving the industry to decrease the time for achieving high-yield, high-value production. Thus, minimizing the total time from detecting a yield problem to fixing it determines the return-on-investment for the semiconductor manufacturer.

Fabricating semiconductor devices, such as logic and memory devices, typically includes processing a semiconductor wafer using a large number of fabrication processes to form various features and multiple levels of the semiconductor devices. For example, lithography is a semiconductor fabrication process that involves transferring a pattern from a reticle to a photoresist arranged on a semiconductor wafer. Additional examples of semiconductor fabrication processes include, but are not limited to, chemical-mechanical polishing (CMP), etch, deposition, and ion implantation. Multiple semiconductor devices may be fabricated in an arrangement on a single semiconductor wafer and then separated into individual semiconductor devices.

Non-uniformity in wafer geometry is a major causes of defect of interest (DOI) formation. A change in topography or stress often leads to defocus or overlay changes in lithography scanners, which can lead to pattern failures. Pattern Wafer Geometry (PWG) tools can measure wafer topography or geometry, but tend to have a poor spatial resolution and lack any method for confirming device failure due to measured geometry features. Furthermore, measuring wafer topography for optically transparent layers can be problematic using PWG tools.

PWG tools suffer from additional deficiencies. First, due to low spatial resolution, PWG tools cannot correlate to defect maps because in a pixel of, for example, 2 mm by 2 mm there can be multiple factors creating defects. These factors can include topography, design, optical proximity correction (OPC), or other mechanisms.

Second, areas with high topography variation with less spatial spread can easily be missed in PWG tools. With a PWG pixel size of 2 mm, PWG data and critical dimension (CD) scanning electron microscope (SEM) data will not match. This mismatch can be because low spatial resolution of PWG tools can fail to catch micro level defects from the wafer map.

Third, there is no method to confirm actual pattern failures at high topographical variation sites found by the PWG tools.

Fourth, due to the lack of vertical information about topography using PWG tools, especially in small spatial regions, topography changes can be missed. This can lead to critical damage of patterns on the wafer.

Fifth, PWG tools can have difficulty giving accurate topography measurement in wafers that have large step height variations.

Therefore, improved metrology techniques are needed.

BRIEF SUMMARY OF THE DISCLOSURE

In a first embodiment, a method is provided. The method includes scanning a wafer with a wafer topography measurement system. Wafer topography data about the wafer is obtained with the wafer topography measurement system. A topography threshold is applied to the wafer topography data using a controller. A metrology sampling plan for the wafer is generated using the controller. The metrology sampling plan includes locations in the wafer topography data above the topography threshold. The wafer is scanned with a scanning electron microscope using the metrology sampling plan. Defects (if any) are identified using the scanning electron microscope based on the metrology sampling plan. The wafer topography measurement system may be a pattern wafer geometry tool or another type of measurement tool.

Critical dimension variations can be measured with respect to a design using an overlay of an image from the scanning electron microscope and the design. The topography variation can correspond to the critical dimension variations.

The wafer topography data can have a resolution above 500 μm.

The defects may be caused by one of design-induced topography or stress-induced topography.

The wafer topography data and critical dimension variation can be measured using a design overlay over patterns.

Defect imaging and measuring critical dimension variation using a design overlay over patterns can be performed.

Surface height variations can be correlated with defect maps. The defect map may be of the wafer or a die of the wafer.

A vertical height on the wafer can be measured with the scanning electron microscope. The measuring can include: fixing a height of a stage that the wafer is disposed on in the scanning electron microscope; fixing a wafer bias of the scanning electron microscope; collecting images based on the metrology sampling plan; calculating sharpness variation across the images; and predicting surface-localized surface height variation. The measuring also can include calculating a height map of at least part of the wafer using the scanning electron microscope.

In a second embodiment, a system is provided. The system includes a controller in electronic communication with a wafer topography measurement system and a scanning electron microscope. The controller includes a processor and an electronic data storage unit in electronic communication with the processor. The controller is configured to: obtain wafer topography data about a wafer from the wafer topography measurement system; apply a topography threshold to the wafer topography data; generate a metrology sampling plan for the wafer; and instruct the scanning electron microscope to scan the wafer using the metrology sampling plan. The metrology sampling plan includes locations in the wafer topography data above the topography threshold. The wafer topography measurement system may be a pattern wafer geometry tool or another type of measurement tool.

The topography data may have a resolution above 500 µm.

The controller can be further configured to correlate surface height variations with defect maps.

The defect map may be of the wafer or of a die of the wafer.

The system can further include the wafer topography measurement system and the scanning electron microscope.

DESCRIPTION OF THE DRAWINGS

For a fuller understanding of the nature and objects of the disclosure, reference should be made to the following detailed description taken in conjunction with the accompanying drawings, in which.

DETAILED DESCRIPTION OF THE DISCLOSURE

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

Information from PWG tools or other wafer topography measurement systems can be used to enable the definition of a metrology sampling plan, where a high accuracy and/or precision tool can make a measurement on specific structures. For example, a wafer topography measurement system such as a PWG tool can be paired with an SEM tool to pinpoint defects created due to topography variations. With its vast coverage on the wafer, the wafer topography measurement system can guide an SEM tool to high topography variation regions, which in turn can find defects by scanning those areas and comparing CD variations with respect to a design. Thus, a SEM tool can be used to counter the spatial resolution issues of PWG tools. SEM tools also can help calculate topography for optically transparent wafers. For example, SEM tools can provide higher resolution wafer geometry or can monitor the topography variation effects using CD measurements. SEM tools also may have better resolution and accuracy in determining the change of topography or CD measurements in a localized region. Optical CD measurement, overlay measurement, and atomic force microscopy also could be used instead of or in conjunction with SEM tools.

There can be multiple ways of determining the topography or pattern failures in a localized region guided by the wafer topography measurement system. High topography or stress variation regions can be highlighted or identified by the wafer topography measurement system, such as a PWG tool. These high topography or stress variation regions can later be visited with an SEM tool and confirmed for DOI location. SEM data can provide a better resolved impact of topography in the region identified by the wafer topography measurement system.

Figure 1:
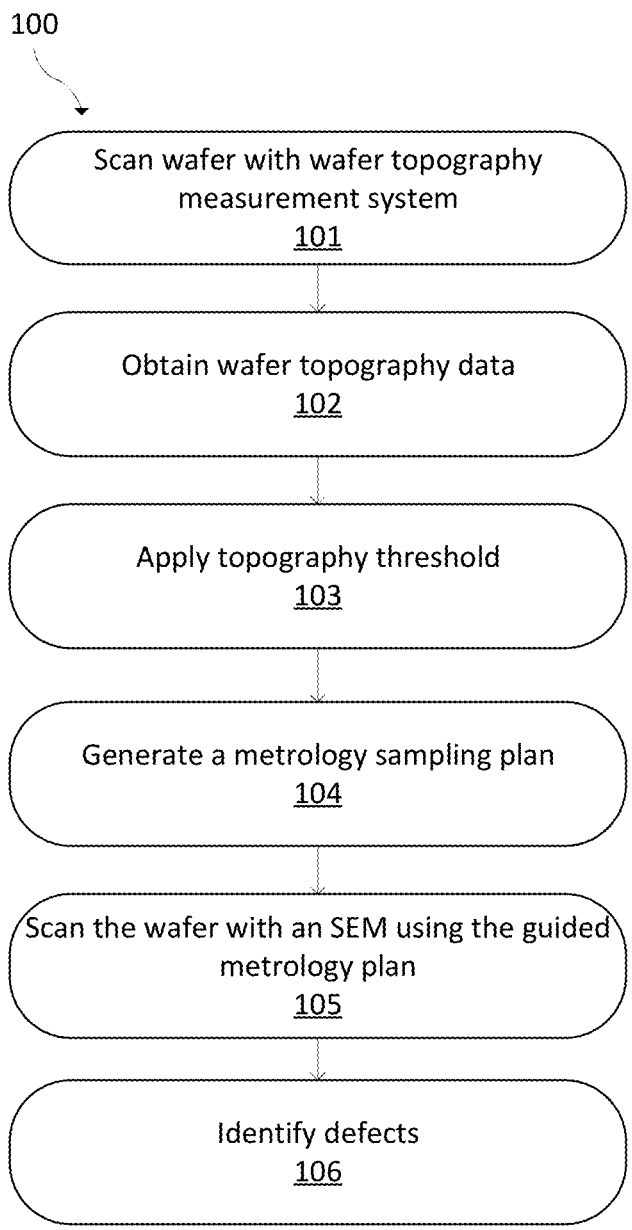
FIG. 1 is a flowchart of an embodiment of a method in accordance with the present disclosure.

FIG. 1 is a flowchart of an embodiment of a method 100. At 101, a wafer is scanned with a wafer topography measurement system. The wafer topography measurement system may be a PWG tool or another type of tool that measures wafer stress, wafer height, or wafer shape. Wafer topography data about the wafer is obtained with the wafer topography measurement system at 102. A PWG tool can measure stress-induced wafer shape changes, wafer shape-induced overlay, wafer thickness variations and wafer frontside and backside topography. The wafer topography data from the wafer topography measurement system can have a resolution above 500 µm. For example, the resolution may be above 200 µm or may be a resolution of approximately 100 µm. The wafer topography data about the wafer can include data about the surface topography and/or the stress profile. This data may include, for example, various statistical attributes such as peak to valley (PV) or mean of metrics like nanotopography (NT) or local shape curvature (LSC). These statistical attributes can be used for hotspot detection or a metrology sampling plan. These statistical attributes can be generated based on a single measurement and can be processed offline using the measured data.

A topography threshold is applied to the wafer topography data at 103. A controller may be used to apply the topography threshold. A topography threshold may depend on the layer of interest. For example, the threshold may be set such that 5% dies fall above the threshold. Wherever volume data (e.g., more than 10 lots) is available, the threshold may be set to mean±3 sigma. Thus, the focus can be on excursions or high variations. Defects which are formed due to topography variation can be filtered out after correlating with data from the wafer topography measurement system. Remaining defects can be formed due to other factors including issues related to process interactions, reticle, design, or OPC.

A metrology sampling plan can be generated at 104, such as using the controller. The metrology sampling plan can include locations in the wafer topography data above the topography threshold. This metrology sampling plan may focus on regions with particular topography or stress measurements.

In an instance, the metrology sampling plan for an SEM is generated based on data from a PWC tool or other metrology data. The metrology data can be interpolated to an attribute associated with a defect. Then this attribute can be used to define defects for sampling. In a particular example, defects falling in the areas of worst wafer flatness are sampled. An automated method can be used to interpolate metrology data to defect data.

The wafer is scanned with an SEM using the metrology sampling plan at 105. Thus, the wafer topography measurement system, such as a PWG tool, can obtain wafer topography information and use this information to guide the SEM for a higher resolution analysis of the topography variations above a given threshold. While an SEM is disclosed, other metrology or inspection tools also can benefit from the metrology sampling plan. For example, other electron beam or optical metrology or inspection tools may benefit.

Defects are identified using the SEM based on the metrology sampling plan at 106. The defects may be caused by one of design-induced topography or stress-induced topography. The identified defects can be failure points, which may be used for process control by a semiconductor manufacturer. For example, the SEM can verify presence of variations or height measurements, which can indicate a wafer stress problem. The SEM can focus on areas with particular topographical or stress features.

Figure 3:
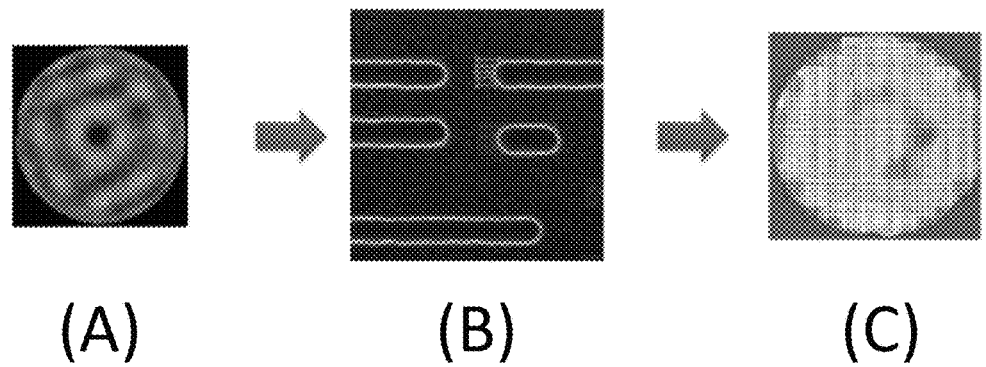
FIG. 3 is an example of data showing that wafer flatness correlates to hot spots.
Figure 3:
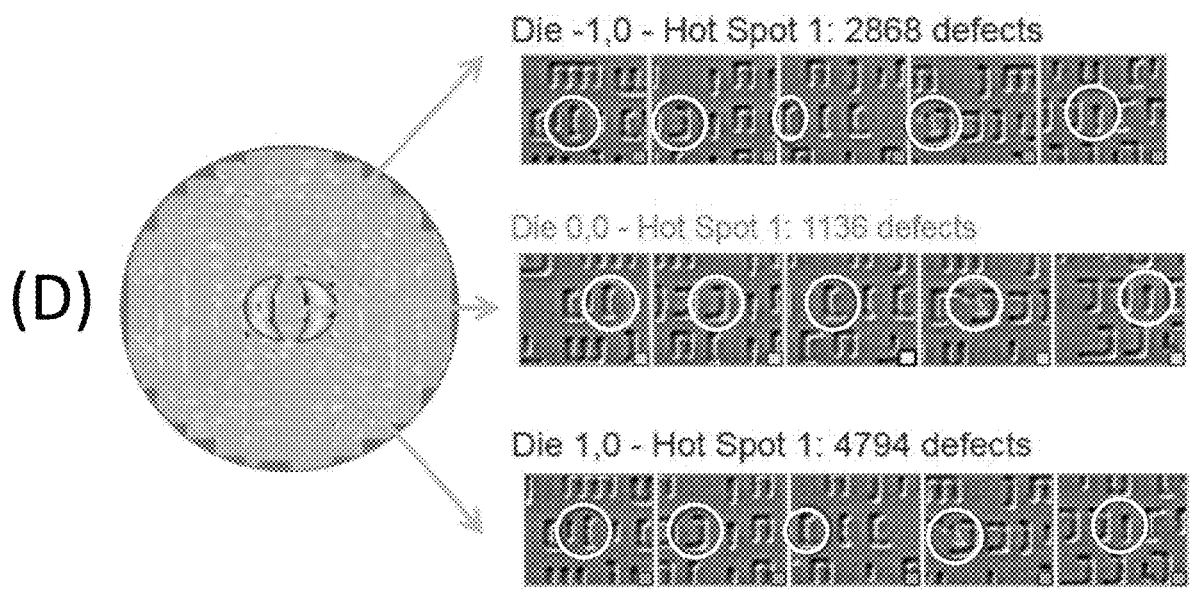

FIG. 3 is an example of data showing that wafer flatness correlates to hot spots. Worse wafer flatness can correspond to hotspots or other areas prone to failure. The wafer topography measurement system (in this example, a PWG tool) generates low spatial resolution height map at (A). The SEM generates high spatial resolution data for pattern data with respect to design and surface topography at (B). The correlation generated with data from the wafer topography measurement system, such as a broad band plasma (BBP) tool, and the SEM can be used to identify defects formed due to topography and/or stress changes, as seen in (C). (D) shows exemplary hot spots that are identified.

Pattern variations can be measured. A quantification of an impact of surface height variation to the CD changes on a patterned wafer can be performed. The wafer topography measurement system can guide and predict broad areas of surface topography variation after which the SEM can obtain images at those locations. The images can then be compared to the corresponding design files, such as using automated algorithms, to determine impact of topography on critical dimension variation.

Critical dimension variations can be measured with respect to a design using an overlay of an image from the SEM and the design. Topography variation can correspond to the critical dimension variations.

The wafer topography data and critical dimension variation measurement can be measured using a design overlay over patterns (e.g., patterns of interest such as hotspots). Any topography variation can induce critical dimension variations in the process step, which can be captured by this technique.

Defect imaging can be performed and critical dimension variation can be measured using a design overlay over patterns.

Surface height variations can be correlated with defect maps. The defect map may be the wafer or of a die of the wafer. This can confirm the correlation between the wafer topography measurement system and the SEM.

Topography can be classified into, for example, design-induced topography or stress-induced topography. Stress-induced topography may be generated by the wafer topography measurement system. Stress induced topography may have some wafer level effect or signature. If stress was associated with some design interaction, an intra-field or intra-die effect or signature may be seen and the stress can be classified.

Furthermore, higher resolution topography data at the guided sites can provide improved detection of defects and/or categorization of defects based on their variations with topography.

A vertical height on the wafer can be measured with the SEM. In an instance, this includes fixing a height of a stage (e.g., a Z height) that the wafer is disposed on in the SEM. A wafer bias of the SEM also can be fixed. Images are collected based on the metrology sampling plan. Sharpness variation across the images can be calculated. Surface-localized surface height variation can be predicted, which can be based on the sharpness variation. In another instance, this includes calculating a height map of at least part of the wafer using the SEM. The Z height sensor can be used to calculate the height map, which can provide a higher resolution than the wafer topography measurement system.

Defects caused by surface topography or stress changes can be discovered. The embodiments disclosed herein can address run-time process issues related to defects caused by surface topography or stress changes with improved spatial resolution and more accurate observations of critical dimension changes. Throughput or resolution problems of previous tools are overcome by combining capabilities of the wafer topography measurement system and the SEM. Pattern failures caused by surface topography or stress changes can be predicted. Based on results using the embodiments disclosed herein, a semiconductor manufacturer can tune a lithography scanner to prevent damage to a wafer. The combination with the SEM tool can help provide a topography map for layers that are transparent to optics of the wafer topography measurement system, such as a PWG tool.

The change in critical dimension with respect to a design can be correlated to topography variation. Here also, the wafer topography measurement system can be a low spatial resolution guide for the SEM to scan regions of high topography and/or stress variation.

Wafer flatness excursion can cause process window collapse. The root cause may be wafer flatness due to the incoming material.

Mismatch between the wafer topography measurement system and SEM data can be compensated for by guidance from the wafer topography measurement system and collecting high resolution SEM images that profile the topography and the defect map. This also can help differentiate defects formed due to stress, topography, and/or other factors. BBP data can be used filter out defects caused by other factors as well.

A high resolution vertical topography map can be generated from a combination of SEM and the wafer topography measurement system.

In instances with large step height variations, SEM tools can give accurate height in the two regions which can then be used by the wafer topography measurement system as a baseline for relative height in individual regions.

The techniques disclosed herein can provide a throughput improvement. For example, a reduction of sample size of approximately 3× (e.g., from approximately 5,000 defects to approximately 1,500 defects) can be realized.

In addition, BBP tool data can provide the input for the discovery of hot spots to identify the specific structures that can be sampled by the high resolution metrology capable tool. For example, metrology attributes can be assigned to defects. A measurement from a particular point on the wafer can be associated to any defects occurring closest to this site versus the next nearest measurement location.

BBP data of nominal wafers that are sampled by wafer topography measurement system or other metrology measurement can enable root cause deconvolution of the pattern failures, which can enable the wafer topology related failures to be effectively prioritized. Besides identifying across wafer topology changes, wafer topography measurement systems can be used to identify localized changes within the die due to a design causing different z-heights of structures. These changes with the across-wafer variation measured on a wafer topography measurement system can enable identification of sites that may be more prone to focus related failures.

Figure 2:
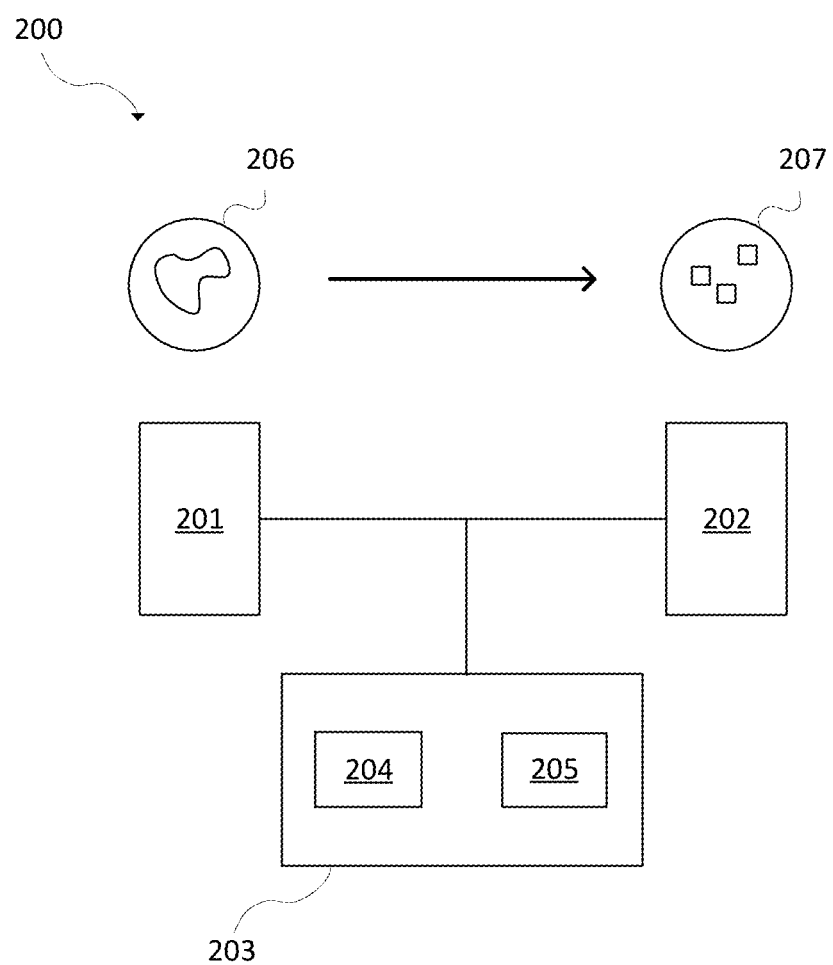
FIG. 2 is a block diagram of an embodiment of a system in accordance with the present disclosure.

FIG. 2 is a system drawing of a system 200. The system 200 includes a wafer topography measurement system 201, an SEM 202, and a controller 203 with a processor 204 and an electronic data storage unit 205 in electronic communication with the processor 204. The wafer inspection tool 201 may be a PWG tool. The controller 203 is in electronic communication with the wafer topography measurement system 201 and the defect review tool 202.

The controller 203 may be part of the wafer topography measurement system 201, the defect review tool 202, or another device. In an example, the controller 203 may be a standalone control unit or in a centralized quality control unit. Multiple controllers 203 may be used.

The controller 203 may be implemented in practice by any combination of hardware, software, and firmware. Also, its functions as described herein may be performed by one unit, or divided up among different components, each of which may be implemented in turn by any combination of hardware, software and firmware. Program code or instructions for the controller 203 to implement various methods and functions may be stored in controller readable storage media, such as a memory in the electronic data storage unit 205 or other memory.

The controller 203 can be configured to receive topography data from the wafer topography measurement system 201 and the SEM 202. The topography data can have a resolution above 500 µm.

The system 200 can include a controller in electronic communication with a wafer topography measurement system 201, such as a PWG tool, and an SEM 202. The controller 203 includes a processor 204 and an electronic data storage unit 205 in electronic communication with the processor 204. The controller 203 is configured to obtain wafer topography data about a wafer from the wafer topography measurement system 201. For example, see the wafer topography data 206. The controller 203 can be configured to then apply a topography threshold to the wafer topography data; generate a metrology sampling plan for the wafer (e.g., the metrology sampling plan 207); and can transmit the metrology sampling plan to the SEM 202. The controller also can be configured to instruct the SEM 202 to scan the wafer using the metrology sampling plan. The metrology sampling plan includes locations in the wafer topography data above the topography threshold. The controller can be further configured to correlate surface height variations with defect maps. The defect map may be of the wafer or a die of the wafer. The defects can be caused by one of design-induced topography or stress-induced topography.

The controller 203 may be coupled to the components of the system 200 in any suitable manner (e.g., via one or more transmission media, which may include wired and/or wireless transmission media) such that the controller 203 can receive the output generated by the system 200. The controller 203 may be configured to perform a number of functions using the output.

The controller 203, other system(s), or other subsystem(s) described herein may be part of various systems, including a personal computer system, image computer, mainframe computer system, workstation, network appliance, internet appliance, or other device. The subsystem(s) or system(s) may also include any suitable processor known in the art, such as a parallel processor. In addition, the subsystem(s) or system(s) may include a platform with high speed processing and software, either as a standalone or a networked tool.

If the system includes more than one subsystem, then the different subsystems may be coupled to each other such that images, data, information, instructions, etc. can be sent between the subsystems. For example, one subsystem may be coupled to additional subsystem(s) by any suitable transmission media, which may include any suitable wired and/or wireless transmission media known in the art. Two or more of such subsystems may also be effectively coupled by a shared computer-readable storage medium (not shown).

An additional embodiment relates to a non-transitory computer-readable medium storing program instructions executable on a controller for performing a computer-implemented detection of design-induced topography or stress-induced topography defects, as disclosed herein. In particular, the processor 204 can be coupled to a memory in the electronic data storage unit 205 or other electronic data storage medium with non-transitory computer-readable medium that includes program instructions executable on the processor 204. The computer-implemented method may include any step(s) of any method(s) described herein. For example, the controller 203 may be programmed to perform some or all of the steps of FIG. 1, which can be executed by the processor 204. The memory in the electronic data storage unit 205 or other electronic data storage medium may be a storage medium such as a magnetic or optical disk, a magnetic tape, or any other suitable non-transitory computer-readable medium known in the art.

The program instructions may be implemented in any of various ways, including procedure-based techniques, component-based techniques, and/or object-oriented techniques, among others. For example, the program instructions may be implemented using ActiveX controls, C++ objects, JavaBeans, Microsoft Foundation Classes (MFC), SSE (Streaming SIMD Extension), or other technologies or methodologies, as desired.

As used herein, the term "wafer" generally refers to substrates formed of a semiconductor or non-semiconductor material. Examples of such a semiconductor or non-semiconductor material include, but are not limited to, monocrystalline silicon, gallium arsenide, and indium phosphide. Such substrates may be commonly found and/or processed in semiconductor fabrication facilities.

A wafer may include one or more layers formed upon a substrate. For example, such layers may include, but are not limited to, a resist, a dielectric material, and a conductive material. Many different types of such layers are known in the art, and the term wafer as used herein is intended to encompass a wafer including all types of such layers.

One or more layers formed on a wafer may be patterned or unpatterned. For example, a wafer may include a plurality of dies, each having repeatable patterned features. Formation and processing of such layers of material may ultimately result in completed devices. Many different types of devices such as integrated circuits may be formed on a wafer, and the term wafer as used herein is intended to encompass a wafer on which any type of device known in the art is being fabricated. As used herein, the term "chip" may comprise a collection of integrated circuits designed for a particular purpose.

Although embodiments are described herein with respect to wafers, it is to be understood that the embodiments may be used for another specimen such as a reticle, which may also be commonly referred to as a mask or a photomask. Many different types of reticles are known in the art, and the terms "reticle," "mask," and "photomask" as used herein are intended to encompass all types of reticles known in the art.

Each of the steps of the method may be performed as described herein. The methods also may include any other step(s) that can be performed by the controller and/or computer subsystem(s) or system(s) described herein. The steps can be performed by one or more computer systems, which may be configured according to any of the embodiments described herein. In addition, the methods described above may be performed by any of the system embodiments described herein.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:

1. A method comprising:
   scanning a wafer with a wafer topography measurement system;
   obtaining wafer topography data about the wafer with the wafer topography measurement system;
   generating, using a controller, a metrology sampling plan for the wafer that limits metrology measurements to locations on the wafer, wherein generating the metrology sampling plan comprises:
      receiving the wafer topography data at the controller, wherein the wafer topography data includes statistical information about a surface topography of the wafer and/or a stress measurement of the wafer;
      interpolating the wafer topography data to an attribute associated with a defect;
      applying a topographic threshold to the attribute with the wafer topography data;
      defining the locations using the wafer topography such that the locations include defects based on the wafer topography data above the topographic threshold, wherein the topographic threshold is set to a non-zero multiple of a standard deviation from a mean; and
      generating instructions for the metrology sampling plan to scan regions with the locations above the topographic threshold;
   scanning the wafer with a scanning electron microscope using the metrology sampling plan; and
   identifying defects using the scanning electron microscope based on the metrology sampling plan.

2. The method of claim 1, further comprising measuring critical dimension variations with respect to a design using an overlay of an image from the scanning electron microscope and the design.

3. The method of claim 2, wherein topography variation corresponds to the critical dimension variations.

4. The method of claim 1, wherein the wafer topography data has a resolution above 500 µm.

5. The method of claim 1, wherein the defects are caused by one of design-induced topography or stress-induced topography.

6. The method of claim 1, further comprising measuring the wafer topography data and critical dimension variation using a design overlay over patterns.

7. The method of claim 1, further comprising defect imaging and measuring critical dimension variation using a design overlay over patterns.

8. The method of claim 1, further comprising correlating surface height variations with defect maps.

9. The method of claim 8, wherein the defect map is of the wafer.

10. The method of claim 8, wherein the defect map is of a die of the wafer.

11. The method of claim 1, further comprising measuring a vertical height on the wafer with the scanning electron microscope.

12. The method of claim 11, wherein the measuring includes:
   fixing a height of a stage that the wafer is disposed on in the scanning electron microscope;
   fixing a wafer bias of the scanning electron microscope;
   collecting images based on the metrology sampling plan;
   calculating sharpness variation across the images; and
   predicting surface-localized surface height variation.

13. The method of claim 11, wherein the measuring includes calculating a height map of at least part of the wafer using the scanning electron microscope.

14. The method of claim 1, wherein the wafer topography measurement system is a pattern wafer geometry tool.

15. A system comprising:
   a controller in electronic communication with a wafer topography measurement system and a scanning electron microscope, wherein the controller includes a processor and an electronic data storage unit in electronic communication with the processor, and wherein the controller is configured to:
   obtain wafer topography data about a wafer from the wafer topography measurement system;
   generate a metrology sampling plan for the wafer that limits metrology measurements to locations on the wafer, wherein generating the metrology sampling plan comprises:
      receiving the wafer topography data at the controller, wherein the wafer topography data includes statistical information about a surface topography of the wafer and/or a stress measurement of the wafer;
      interpolating the wafer topography data to an attribute associated with a defect;
      applying a topographic threshold to the attribute with the wafer topography data;
      defining the locations using the wafer topography threshold such that the locations include defects based on the wafer topography data above the topographic threshold, wherein the topographic threshold is set to a non-zero multiple of a standard deviation from a mean; and
      generating instructions for the metrology sampling plan to scan regions with the locations above the topographic threshold;
   instruct the scanning electron microscope to scan the wafer using the metrology sampling plan.

16. The system of claim 15, wherein the wafer topography measurement system is a pattern wafer geometry tool.

17. The system of claim 15, wherein the topography data has a resolution above 500 µm.

18. The system of claim 15, wherein the controller is further configured to correlate surface height variations with defect maps.

19. The system of claim 18, wherein the defect map is of the wafer or is of a die of the wafer.

20. The system of claim 15, wherein the system further includes the wafer topography measurement system and the scanning electron microscope.

* * * * *